US012568814B2

(12) United States Patent
Ghosh et al.

(10) Patent No.: US 12,568,814 B2
(45) Date of Patent: Mar. 3, 2026

(54) BURIED POWER RAIL DIRECTLY CONTACTING BACKSIDE POWER DELIVERY NETWORK

(71) Applicant: International Business Machines Corporation, Armonk, NY (US)

(72) Inventors: Somnath Ghosh, Clifton Park, NY (US); Fee Li Lie, Albany, NY (US); Ruilong Xie, Niskayuna, NY (US); Kisik Choi, Watervliet, NY (US)

(73) Assignee: International Business Machines Corporation, Armonk, NY (US)

( * ) Notice: Subject to any disclaimer, the term of this patent is extended or adjusted under 35 U.S.C. 154(b) by 651 days.

(21) Appl. No.: 17/935,331

(22) Filed: Sep. 26, 2022

(65) Prior Publication Data

US 2024/0105607 A1      Mar. 28, 2024

(51) Int. Cl.
| | |
|---|---|
| *H01L 23/528* | (2006.01) |
| *H01L 23/48* | (2006.01) |
| *H01L 23/522* | (2006.01) |
| *H10D 84/01* | (2025.01) |
| *H10D 84/03* | (2025.01) |

(52) U.S. Cl.
CPC ........ *H01L 23/5286* (2013.01); *H01L 23/481* (2013.01); *H01L 23/5226* (2013.01); *H10D 84/0149* (2025.01); *H10D 84/038* (2025.01)

(58) Field of Classification Search
CPC ............... H01L 23/5286; H01L 23/481; H01L 23/5226; H10D 84/038; H10D 84/0149
USPC ........................................................ 257/621
See application file for complete search history.

(56) References Cited

U.S. PATENT DOCUMENTS

| | | | |
|---|---|---|---|
| 8,298,906 B2 | 10/2012 | Bernstein | |
| 10,636,739 B2 | 4/2020 | Beyne | |
| 11,056,419 B2 | 7/2021 | Lin | |
| 11,270,977 B2 | 3/2022 | Jain | |
| 2012/0292777 A1 | 11/2012 | Lotz | |
| 2018/0145030 A1* | 5/2018 | Beyne | H01L 21/76898 |
| 2020/0135634 A1* | 4/2020 | Chiang | H10D 64/251 |
| 2020/0266169 A1 | 8/2020 | Kang | |
| 2021/0305130 A1 | 9/2021 | Cho | |
| 2022/0077062 A1 | 3/2022 | Van Dal | |

FOREIGN PATENT DOCUMENTS

EP            3324436 B1      8/2020

* cited by examiner

*Primary Examiner* — Tu-Tu V Ho
(74) *Attorney, Agent, or Firm* — Jeffrey M. Ingalls

(57) ABSTRACT

An approach to form a semiconductor structure with a plurality of buried power rails in a semiconductor substrate where at least one buried power rail extends below the backside of the semiconductor substrate. The semiconductor structure provides at least one portion of the first metal layer of the backside power delivery network that surrounds a bottom portion of the buried power rail below the backside of the semiconductor substrate. The bottom portion of the buried power rail is in direct contact with the portion of the first metal layer of the backside power delivery network where the buried power rail and the first metal layer are composed of the same conductive material. The semiconductor structure includes a portion of an interlayer dielectric material isolating the first metal layer of the backside power distribution network from the backside of the semiconductor substrate.

18 Claims, 3 Drawing Sheets

1200

100
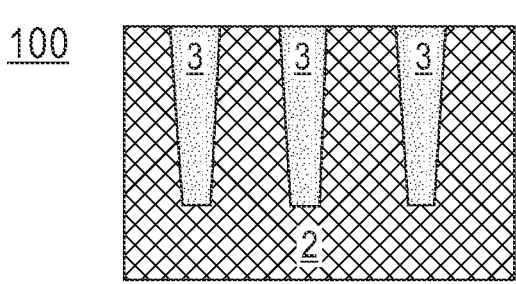
FIG. 1
200A
200B
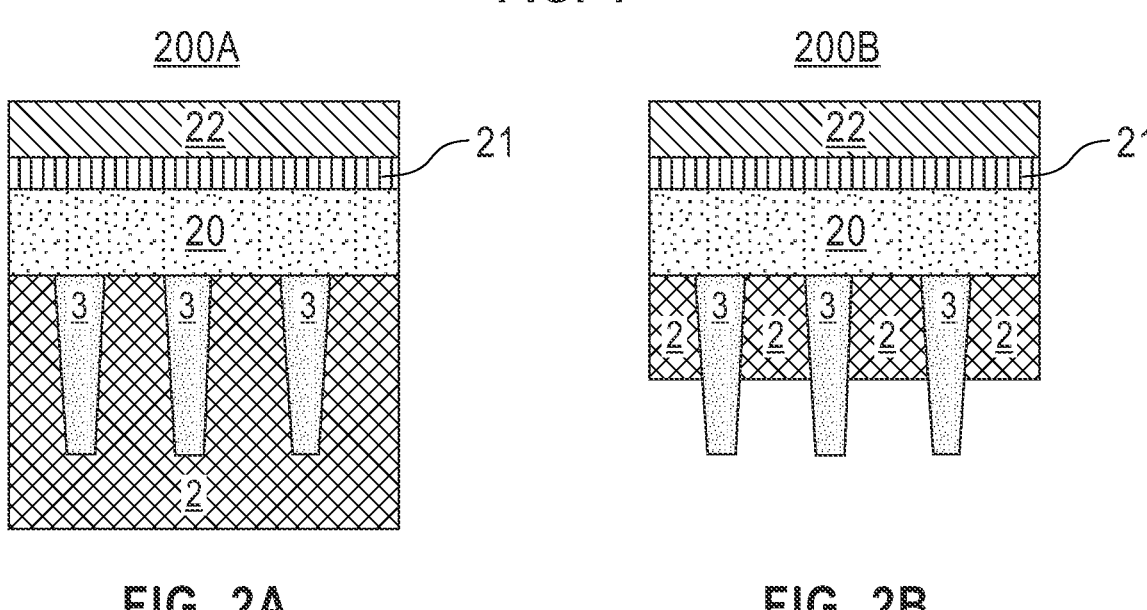
FIG. 2A                    FIG. 2B
300
400
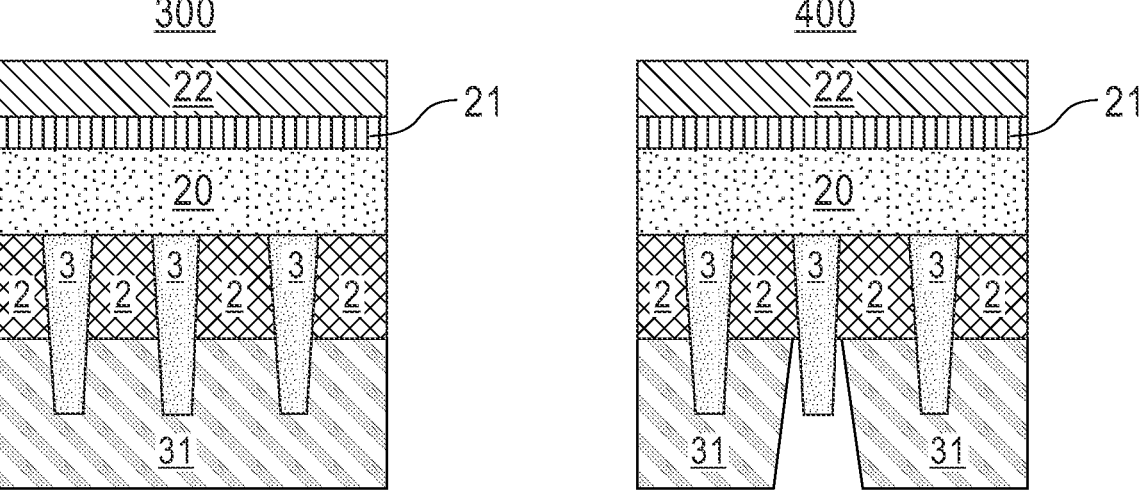
FIG. 3                    FIG. 4

500

600

700

800

900
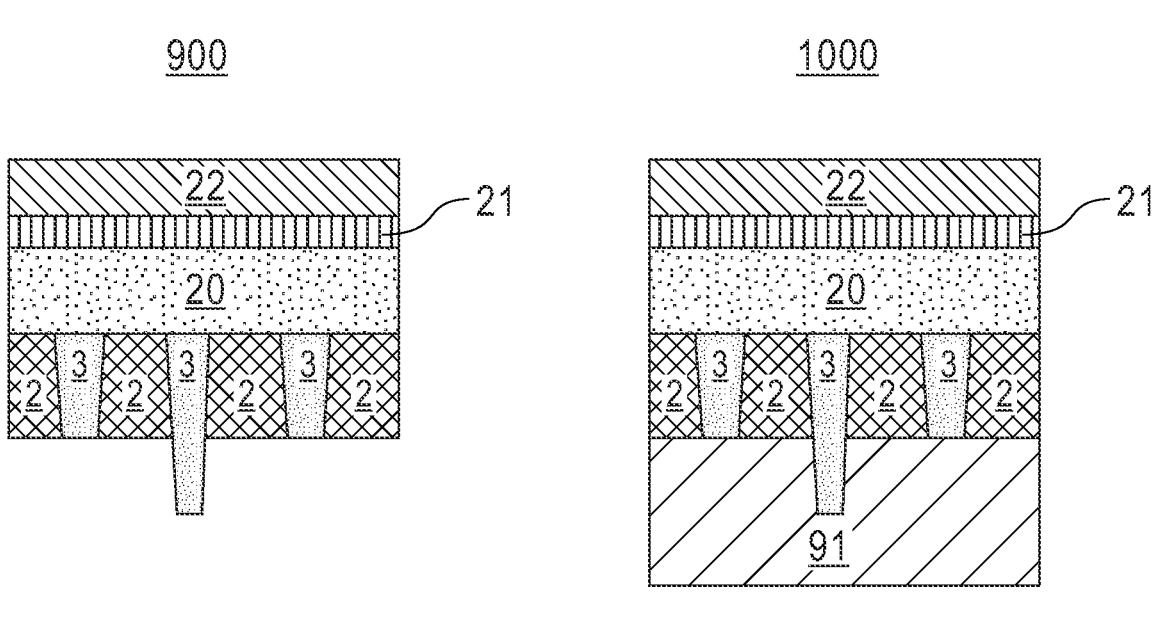
FIG. 9
1000
FIG. 10
1100
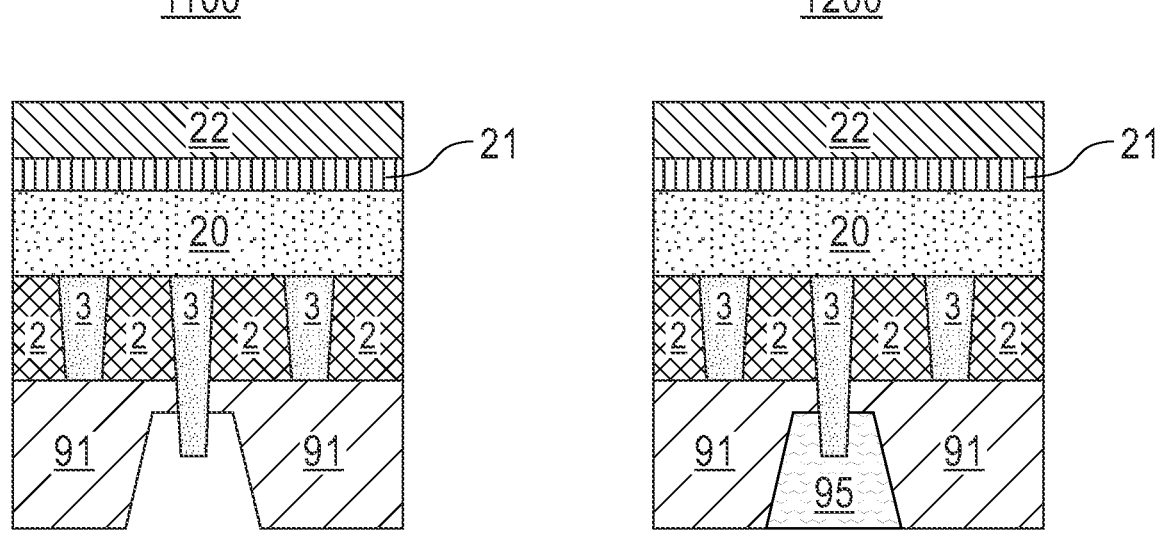
FIG. 11
1200
FIG. 12

BURIED POWER RAIL DIRECTLY CONTACTING BACKSIDE POWER DELIVERY NETWORK

BACKGROUND OF THE INVENTION

The present invention relates generally to the field of semiconductor device manufacture and more particularly to the formation of buried power rails for semiconductor devices.

Semiconductor device manufacturing and device design are continually packaging more circuits into semiconductor chips as line widths and spacing between device elements shrink in the nanoscale range. Typically, transistors are formed on the semiconductor substrate and are connected by layers of interconnects and power structures formed above the transistors. Conventional power rails, commonly used with memory devices such as static random-access memory (SRAM), typically reside in the interconnect layers above the transistors. Conventional power rails in interconnect layers consume a significant amount of area available for other interconnections. Conventional power rails can create congestion in the interconnection layers reducing space for other wires and connections.

In order to free up area in the interconnect wiring, power rails can be moved down into the semiconductor substrate to form buried power rails. With buried power rails in the semiconductor substrate, power rails in the interconnect layers are no longer required and the area used for power rails in the interconnect layers is now available for other wiring needs. Reduced congestion in interconnect wiring layers due to the removal of power rails can provide additional area for wiring and/or larger wires and space for improved electrical performance.

SUMMARY

Embodiments of the present invention provide a semiconductor structure with a plurality of buried power rails in a semiconductor substrate where at least one buried power rail extends below the backside of the semiconductor substrate. Embodiments of the present invention provide at least one portion of the first metal layer of the backside power delivery network that directly surrounds a bottom portion of the buried power rail extending below the backside of the semiconductor substrate. Embodiments of the present invention provide at least one buried power rail in direct contact with a portion of the first metal layer where the buried power rail and the first metal layer are composed of the same conductive material. Embodiments of the present invention provide a portion of an interlayer dielectric material isolating the first metal layer of the backside power distribution network from the backside of the semiconductor substrate.

Embodiments of the present invention provide a method of forming a semiconductor structure that includes forming a buried power rail from the front side of a semiconductor substrate and forming the interconnect wiring over the frontside of the semiconductor substrate and the buried power rail. The method includes bonding a carrier wafer to the front side of the semiconductor substrate followed by thinning of the semiconductor substrate. The method includes recessing the semiconductor substrate so that a portion of the buried power rail extends below the surface of the backside of the semiconductor substrate and depositing an optical planarization layer over the backside of the semiconductor substrate. The method includes etching a portion of the optical planarization layer to expose a bottom portion of the buried power rail and depositing a layer of spin-on glass on the optical planarization layer and around the buried power rail. The method includes removing the optical planarization layer and removing the spin-on glass around the buried power layer. The method includes depositing an interlayer dielectric over the semiconductor substrate and the buried power layer and directly forming one of a via, a contact, or a wire around the bottom portion of the buried power rail.

BRIEF DESCRIPTION OF THE DRAWINGS

The above and other aspects, features, and advantages of various embodiments of the present invention will be more apparent from the following description taken in conjunction with the accompanying drawings.

FIG. 1 depicts a cross-sectional view of a semiconductor structure illustrating buried power rails (BPRs) within a semiconductor substrate, in accordance with an embodiment of the present invention.

FIG. 2A depicts a cross-sectional view of the semiconductor structure after forming interconnect wiring layers over the BPRs and the frontside of the semiconductor substrate and bonding a carrier wafer to the interconnection wiring, in accordance with an embodiment of the present invention.

FIG. 2B depicts a cross-sectional view of the semiconductor structure after recessing exposed portions of a backside of the semiconductor substrate, in accordance with an embodiment of the present invention.

FIG. 3 depicts a cross-sectional view of the semiconductor structure after depositing a layer of optical planarizing material (OPL) under the semiconductor substrate, in accordance with an embodiment of the present invention.

FIG. 4 depicts a cross-sectional view of the semiconductor structure after etching a via hole in the OPL, in accordance with an embodiment of the present invention.

FIG. 9 depicts a cross-sectional view of the semiconductor structure after removing the remaining spin-on-glass, in accordance with an embodiment of the present invention.

FIG. 10 depicts a cross-sectional view of the semiconductor structure after depositing a layer of an interlayer dielectric (ILD) on the backside of the semiconductor substrate, in accordance with an embodiment of the present invention.

FIG. 11 depicts a cross-sectional view of the semiconductor structure after patterning and etching the ILD on the backside of the semiconductor substrate, in accordance with an embodiment of the present invention.

FIG. 12 depicts a cross-sectional view of the semiconductor structure after depositing a metal layer on the ILD and performing a chemical-mechanical polish (CMP), in accordance with an embodiment of the present invention.

DETAILED DESCRIPTION

Figure 5:
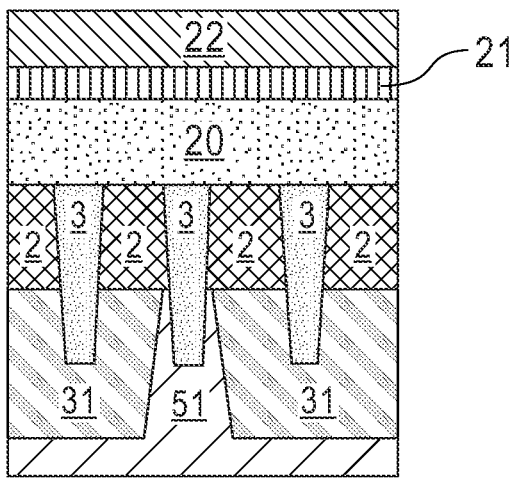
FIG. 5 depicts a cross-sectional view of the semiconductor structure after depositing a layer of spin-on-glass (SOG) on the OPL, in accordance with an embodiment of the present invention.

Embodiments of the present invention recognize that in semiconductor structures with conventionally formed buried power rails, vias extend up from a bottom surface of a backside power delivery network under the semiconductor substrate through one or more layers of the backside power delivery network (BSPDN) to connect to the buried power rail in the semiconductor substrate. The vias connecting the buried power rail to the BSPDN typically have liners composed of a different material than the buried power rail and the BSPDN. The different material interfaces between the via liner, the buried power rail liner, the buried power rail, and the first layer of metallization of the BSPDN cause discontinuities and increase the electrical resistance in the signal path between the different materials of the buried power rails, the vias, the liners, and the first metal layer of the BSPDN. The material interfaces and different materials in the electrical signal path between the semiconductor devices above the semiconductor substrate and the backside power delivery network in the semiconductor structure increase the electrical resistance in the signal path. Embodiments of the present invention recognize methods of forming a semiconductor structure that reduces the number of interfaces between different conductive materials or metals would be desirable and improve the electrical performance of the semiconductor structure.

Embodiments of the present invention recognize that, in conventional methods of forming buried power rails, manufacturing challenges arise when using the vias formed through the layers of the backside power delivery network need to contact the bottom surface of conventionally formed buried power rails. In conventionally formed semiconductor structures, the conventionally formed vias from the bottom surface of the BSPDN need to connect with a portion of a conventional buried power rail that is exposed on the backside of the semiconductor substrate. The conventionally formed vias etched are from the bottom of the BSPDN and have narrowing diameters as the vias extend through the layers of the BSPDN. The narrowing bottom portion of the conventionally formed vias need to contact the exposed surfaces of the buried power rails in the semiconductor substrate. Conventionally formed buried power rails also narrow as the buried power rails extend down through the semiconductor substrate. The ability to contact the bottom surface of a conventional buried power rail with the narrow or small diameter of the bottom of the vias in the BSPDN adversely affects the manufacturing yields.

Embodiments of the present provide methods to form a semiconductor structure with buried power rails extending below the backside of the semiconductor substrate and extending directly into a portion of the first layer of metallization in the BSPDN. Embodiments of the present invention provide a semiconductor structure with an electrical signal path between the buried power rails and the first layer of metallization of the BSPDN that has minimal electrical discontinuities caused by the interfaces between different materials in the electrical signal path. Embodiments of the present invention provide buried power rails and the first metal layer of the BSPDN that are composed of the same metal material and where the buried power rails and the first metal layer of the BSPDN are deposited without a liner material. The bottom portion of the buried power rail directly contacts a portion of the first metal layer of the BSPDN. In this way, electrical signals can move through a single conductive material or metal from the semiconductor substrate through the buried power rail to the first metal layer of the BSPDN without dissimilar material interfaces causing electrical signal path discontinuities that increase the electrical resistance. Embodiments of the present invention use the same conductive material for both the buried power rail and the first layer of the BSPDN contacting the buried power rail. Embodiments of the present invention provide buried power rails and the first metal layer of the BSPDN without liners where both the buried power rails and the first metal layer of the BSPDN are composed of the same conductive material. Embodiments of the present invention provide semiconductor structures that improve the electrical performance of the semiconductor structures at least by reducing the different material interfaces between the buried power rail and the first metal layer of the BSPDN.

Additionally, embodiments of the present invention provide a semiconductor structure where the bottom portion of each of the buried power rails extending below the backside of the semiconductor substrate is, at least in part, embedded in a portion of a feature, such as a via, a contact, or a wire, formed in the first metal layer of the BSPDN. Directly embedding the bottom portion of the buried power rail in the portion of the first metal layer of the BSPDN both increases the contact area of the buried power rail with the BSPDN and decreases the electrical resistance in the semiconductor structure. Directly embedding the bottom portion of the buried power rail into a portion of the first metal layer of the BSPDN provides a larger contact area between the buried power rail and the first metal layer of the BSPDN than conventional contact areas of buried power rails to the BSPDN by backside vias and improves the electrical performance of the semiconductor structure disclosed in the embodiments of the present invention.

Embodiments of the present invention provide a method and a semiconductor structure to form buried power rails from the front side of the semiconductor substrate where the semiconductor substrate is then thinned after forming the BPR. Portions of the thinned semiconductor substrate are then further recessed. In this way, the semiconductor structure after recessing portions of the semiconductor substrate provides a portion of one or more of the buried power rails extending below the backside of the semiconductor substrate.

Additionally, embodiments of the present invention use lithography and an etching process such as a dry etch from the backside of the semiconductor structure to form a via hole for a via or trench for a wire in a portion of the first interlayer dielectric of the BSPDN that connects to the bottom portion of a buried power rail in the first interlayer dielectric of the BSPDN. The buried power rail extends below the backside of the semiconductor substrate reducing the depth of the etching process to contact the buried power rail. The trench or via hole does not need to extend completely through the first layer of interlayer dielectric in the BSPDN to contact the buried power rail and eases the manufacturing processes and improves yields compared to conventional processes to connect a conventional buried power rail with the BSPDN. Embodiments of the present invention provide a buried power rail where at least a portion of the buried power rail can be a nanoscale through-silicon via that connects from the BSPDN through an upper portion of the buried power rail in the semiconductor substrate to the top surface of the semiconductor substrate.

Embodiments of the present invention provide a method of forming a deep buried power rail to form a nanoscale TSV by etching and filling a deep hole or trench in the semiconductor substrate to create buried power rails in the semiconductor substrate, forming the back end of the line (BEOL) interconnect wiring over the top surface of the buried power rails and the semiconductor substrate, and then, performing known wafer bonding to attach a carrier wafer to the top surface of the BEOL interconnect wiring. The method includes using wafer thinning and then, silicon recessing around the buried power rails (BPRs). The method includes depositing an optical planarization layer (OPL) on the backside of the semiconductor substrate after semiconductor substrate recessing. The method includes etching a portion of the OPL to expose a bottom portion of at least one of the BPR and depositing a layer of spin-on material, such as spin-on glass over the OPL and the exposed portion of the BPR, and then, planarizing the spin-on glass. The method includes removing the OPL and removing the bottom portion of the exposed BPRs that are under the semiconductor substrate. The method includes removing the remaining portion of the spin-on glass encapsulating at least one of the BPRs. A layer of ILD is deposited over the backside of the semiconductor substrate and around the BPR extending below the backside of the semiconductor substrate. The method includes forming a via as a contact in the first metal layer of the BSPDN or a wire in the BSPDN where the via or the wire wrap directly around the bottom portion of the buried power rail. The method of embodiments of the present invention includes depositing the same metal or conductive material for both the BPR and the via in the BSPDN and where neither BPR nor the via in the BSPDN are formed using a liner (e.g., the buried power rail metal and the via metal are directly deposited on the semiconductor substrate and the first ILD of the BDPDN, respectfully).

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. Some of the process steps, depicted, can be combined as an integrated process step. In addition, descriptions of well-known functions and constructions may be omitted for clarity and conciseness.

The terms and words used in the following description and claims are not limited to the bibliographical meanings but are merely used to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces unless the context clearly dictates otherwise.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" or "contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Detailed embodiments of the claimed structures and methods are disclosed herein. The method steps described below do not form a complete process flow for manufacturing integrated circuits on semiconductor chips. The present embodiments can be practiced in conjunction with the integrated circuit fabrication techniques for semiconductor chips and devices currently used in the art, and only so much of the commonly practiced process steps are included as are necessary for an understanding of the described embodiments. The figures represent cross-section portions of a semiconductor chip or a substrate, such as a semiconductor wafer during fabrication, and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

References in the specification to "one embodiment", "other embodiment", "another embodiment", "an embodiment," etc., indicate that the embodiment described may include a particular feature, structure, or characteristic, but every embodiment may not necessarily include the particular feature, structure or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

Deposition processes for the metal materials and sacrificial material include, e.g., chemical vapor deposition (CVD), physical vapor deposition (PVD), atomic layer deposition (ALD), or gas cluster ion beam (GCIB) deposition. CVD is a deposition process in which a deposited species is formed as a result of a chemical reaction between gaseous reactants at greater than room temperature (e.g., from about 25 C to about 900 C.). The solid product of the reaction is deposited on the surface on which a film, coating, or layer of the solid product is to be formed. Variations of CVD processes include, but are not limited to, atmospheric pressure CVD (APCVD), low-pressure CVD (LPCVD), plasma enhanced CVD (PECVD), and metal-organic CVD (MOCVD), and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use gas cluster ion beams (GCIB) deposition, the high-pressure gas is allowed to expand in a vacuum, subsequently condensing into clusters. The clusters can be ionized and directed onto a surface, providing a highly anisotropic deposition.

Selectively etching as used herein includes but is not limited to patterning using one of lithography, photolithography, an extreme ultraviolet (EUV) lithography process, or any other known semiconductor patterning process followed by one or more etching processes. Various materials are referred to herein as being removed or "etched" whereas etching generally refers to one or more processes implementing the removal of one or more materials while leaving other protected areas of the materials that are masked during the lithography processes unaffected. Some examples of etching processes include but are not limited to the following processes, such as a dry etching process using a reactive ion etch (RIE) or ion beam etch (IBE), a wet chemical etch process, or a combination of these etching processes. A dry etch may be performed using a plasma. Ion milling, sputter etching, or reactive ion etching (RIE) bombards the wafer with energetic ions of noble gases that approach the wafer approximately from one direction, and therefore, these processes are an anisotropic or directional etching process.

As known by one skilled in the art, damascene processes for forming circuit lines, vias, and/or contacts typical include various steps of patterning of via holes and trenches in a dielectric material, such as an interlayer dielectric (ILD) and filling the via holes and trenches with a layer of metal and planarizing the metal using a chemical mechanical (CMP) process to remove overburden or excess metal.

Reference will now be made in detail to the embodiments of the present invention, examples of which are illustrated in the accompanying drawings, wherein like reference numerals refer to like elements throughout.

FIG. 1 depicts a cross-sectional view of semiconductor structure 100 depicting buried power rails (BPRs) 3 in substrate 2, in accordance with an embodiment of the present invention. As depicted, FIG. 1 includes substrate 2 and BPRs 3 included in semiconductor structure 100. Not depicted in semiconductor structure 100 are any number of front end of line (FEOL) semiconductor devices (e.g., planar field-effect transistors (FETs), finFETs, and any other known FEOL semiconductor devices) included in substrate 2. FIG. 1 depicts three BPR 3 but embodiments of the present invention are not limited to three BPR 3 or to the locations and spacing of BPR 3 depicted in FIG. 1.

Substrate 2 is composed of any semiconductor substrate material suitable for forming one or more semiconductor devices with a buried power rail (BPR). In various embodiments, substrate 2 is silicon. In other embodiments, substrate 2 is composed of one of any group IV, group III-V semiconductor material, group II-VI semiconductor material, or group IV semiconductor material. In other examples, substrate 2 may be composed of materials including, for example, III-V compound semiconductor materials (e.g., SiC, GaAs, or InAs), ZnTe, CdTe, ZnCdTe, or other II-VI compound semiconductor materials or alloys of GaAlAs, InGaAs, InAlAs, InAlAsSb, InAlAsP, and InGaAsP. In various embodiments, substrate 2 is a wafer or a portion of a wafer. In some embodiments, substrate 2 includes one or more of doped, undoped, or contains doped regions, undoped regions, or defect-rich regions. In an embodiment, substrate 2 is one of a layered semiconductor substrate, such as a semiconductor-on-insulator substrate (SOI) or silicon-on-replacement insulator (SRI).

Any number of BPR 3 can be present in substrate 2. Three BPR 3 are depicted in FIG. 3. As known to one skilled in the art, some of the FEOL semiconductor devices (not depicted) may reside in substrate 2 around or adjacent to BPR 3. The top surface of substrate 2 can be patterned and a via can be etched for a deep BPR using one or more etching processes before the wafer thinning occurs in later processes steps. The holes for BPR 3 are deeply etched in the unthinned top surface of substrate 2 (i.e., before the wafer thinning of substrate 2 occurs in later process steps). For example, a dry etch process such as but not limited to a plasma or ME can etch the vias or trenches for the deep buried power rails. The depth of the via hole or trench for the formation of BPR 3 can be greater than a typical via hole or trench for a conventional BPR. For example, a via hole for BPR 3 can have a depth ranging from 80 to 300 nm but is not limited to this range. The depth of via hole or trench for BPR 3 may vary according to substrate 2 thickness and the length of the desired extension of BPR 3 after substrate 2 thinning and recessing in later process steps. Additionally, to etch the via hole for BPR 3 deeper, the width of the via hole on the top surface of substrate 2 is larger than the typical via hole for convention BPRs.

BPR 3 can be composed of any material used in a buried power rail. For example, BPR 3 can be filled with a conductive material or a metal material of known resistance, such as but not limited to tungsten (W), ruthenium (Ru), cobalt (Co), copper (Cu), aluminum (Al)). In some embodiments, BPR 3 includes an additional adhesion layer such as TiN, TaN, etc. around the inside surfaces of the via hole in substrate 2 that forms BPR 3. In various embodiments, as depicted, BPR 3 is formed by directly depositing the buried power rail conductive material or metal (e.g., W) inside of a via hole formed in substrate 2. In some cases (not depicted), BPR 3 may include a dielectric liner (e.g., SiCO or another suitable dielectric material) between BPR 3 and substrate 2.

FIG. 2A depicts a cross-sectional view of semiconductor structure 200A after forming interconnect wiring 20 on BPR 3 and substrate 2, depositing interface material 21, and joining carrier wafer 22, in accordance with an embodiment of the present invention. As depicted, FIG. 2A includes the elements of FIG. 1 and interconnect wiring 20, interface material 21, and carrier wafer 22. As known to one skilled in the art, interconnect wiring 20 may include various semiconductor devices, vias, power planes, metal and dielectric material layers not specifically depicted in FIG. 2A.

Interface material 21 can be any known interface material such as but not limited to an oxide material that is deposited over the surface of interconnect wiring 20 using known processes. Bonding of a carrier wafer to a BEOL wiring structure, such as interconnect wiring 20. is a known semiconductor manufacturing process. Carrier wafer 22 may be silicon or another conventional carrier wafer material.

While FIG. 2A depicts carrier wafer 22 as the top surface of semiconductor structure 200A and the bottom surface of substrate 2 is a portion of the bottom of semiconductor structure 200A, in other embodiments, semiconductor structure 200A may be flipped so that the bottom surface of substrate 2 is the top surface of semiconductor structure 200A and carrier wafer 22 creates the bottom surface of semiconductor structure 200A. When semiconductor structure 200B is flipped (not depicted), the bottom surface of substrate 2 is exposed to form the backside power delivery network (PDSN) in later process steps.

FIG. 2B depicts a cross-sectional view semiconductor structure 200B after recessing the exposed surface of substrate 2, in accordance with an embodiment of the present invention. As depicted, FIG. 2B includes the elements of FIG. 2A without a portion of substrate 2. After bonding carrier wafer 22 to interconnect wiring 20, in various embodiments, wafer thinning occurs, for example, by backside wafer grind. Substrate 2 can be further thinned or recessed using one or more dry or wet etching processes. The recessing process to further reduce the thickness of substrate 2 by wet or dry etching processes on the backside of substrate 2 exposes a bottom portion of BPR 3.

After substrate 2 recessing, the bottom portion of each of BPR 3 extend below the surface of the backside of substrate 2. For example, the bottom portion of each of BPR 3 exposed after recessing substrate 2 recess can typically extend from 40 to 150 nm below the bottom surface of substrate 2 but are not limited to this extension length below the surface of substrate 2. After the etching process exposing the bottom portions of each BPR 3, the exposed bottom portion of BPR 3 tapers and is thinner than the upper portions of BPR 3 remaining within substrate 2. In various embodiments, the exposed bottom portion of BPR 3 forms a nano through-silicon via when processing of the semiconductor device is complete. As previously discussed, the backside of substrate 2 is depicted as under substrate 2 in FIG. 2B but, in conventional semiconductor manufacturing, the backside of substrate 2 can be the top surface of semiconductor structure 200B when the semiconductor wafer is flipped (not depicted in FIG. 2B).

FIG. 3 depicts a cross-sectional view of semiconductor structure 300 after depositing a layer of optical planarizing material (OPL) 31 on the backside of substrate 2 and around exposed portions of BPR 3, in accordance with an embodiment of the present invention. As depicted, FIG. 3 includes the elements of FIG. 2B and OPL 31. Using known deposition processes, such as a spin-on deposition process, OPL 31 is deposited on the backside of substrate 2 and around the exposed bottom portions of BPR 3. OPL 31 completely covers and extends beyond BPR 3 (e.g., the layer of OPL 31 is thicker than the length of the exposed extension of BPR 3). After OPL 31 deposition, a CMP planarizes the exposed surface of OPL 31 on the backside of substrate 2.

FIG. 4 depicts a cross-sectional view of semiconductor structure 400 after etching a via hole OPL 31, in accordance with an embodiment of the present invention. As depicted, FIG. 3 includes the elements of FIG. 3 without a portion of OPL 31 over one of BPR 3. In semiconductor structure 400, the via hole is formed over one of BPR 3, however, in other examples, more than one BPR 3 can be exposed by forming more via holes around other BPR 3 (not depicted in FIG. 4).

Using known patterning and etching processes, the surface of OPL 31 is patterned and then, etched forming a hole extending down to the surface of substrate 2. As depicted in FIG. 4, the hole is around one of BPR 3 and creates a space between the sides of BPR 3 and the vertical sides of the remaining portion of OPL 31. The hole around BPR 3 extends from the surface of the backside of substrate 2 to the surface of OPL 31.

FIG. 5 depicts a cross-sectional view of semiconductor structure 500 after depositing a layer of spin-on-glass (SOG) 51 on the OPL 31, in accordance with an embodiment of the present invention. As depicted, FIG. 5 includes the elements of FIG. 4 and SOG 51. Using known spin-on processes for depositing a material, such as but not limited to SOG or a flowable oxide, for SOG 51. As depicted in FIG. 5, SOG 51 can be deposited over the surface of OPL 31, inside the via hole in OPL 31, and around exposed surfaces of the bottom portion of one of BPR 3 that is inside the via hole.

Figure 6:
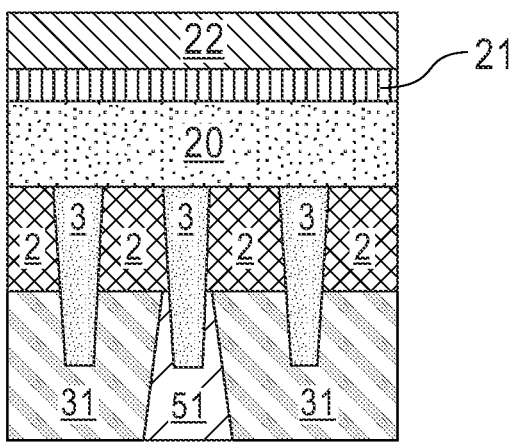
FIG. 6 depicts a cross-sectional view of the semiconductor structure after etching back the layer of spin-on-glass, in accordance with an embodiment of the present invention.

FIG. 6 depicts a cross-sectional view of semiconductor structure 600 after etching back SOG 51, in accordance with an embodiment of the present invention. As depicted, FIG. 6 includes the elements of FIG. 5 with an exposed portion of SOG 51 removed. For example, after patterning by lithography, using a wet or dry etching process (e.g., RIE), the exposed bottom surface of SOG 51 under OPL 31 is removed. In some cases, a small amount of the bottom portion of OPL 31 is also removed. In various embodiments, after the etch back of SOG 51, a portion of SOG 51 in the previously deposited in the via hole around BPR 3 remains. As depicted in FIG. 6, a small portion of SOG 51 remains on a portion of substrate 2 and around the portion of the middle BPR 3 inside the via hole in OPL 31. As previously discussed, in other examples (not depicted), the bottom surface of OPL 31 and the bottom surface of the remaining portion of SOG 51 depicted in FIG. 6 may be the top surface of the semiconductor structure (e.g., in cases where semiconductor structure 600 is flipped so that carrier wafer 22 is below substrate 2 for manufacturing purposes). While not depicted in the Figures of the present invention, as known to one skilled in the art, any of the semiconductor structures depicted herein may be flipped for manufacturing purposes.

Figure 7:
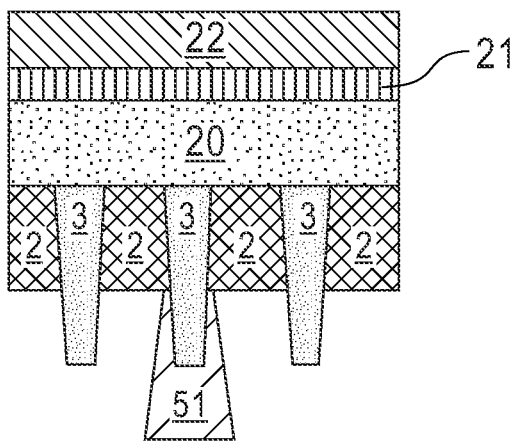
FIG. 7 depicts a cross-sectional view of the semiconductor structure after removing the OPL, in accordance with an embodiment of the present invention.

FIG. 7 depicts a cross-sectional view of semiconductor structure 700 after removing OPL 31, in accordance with an embodiment of the present invention. As depicted, FIG. 7 includes the elements of FIG. 6 without OPL 31. OPL 31 can be removed, for example, using a dry ash process, a wet etching process, or another known OPL removal process. After removing OPL 31, the bottom portions of two of BPR 3 extending beyond the surface of the backside of substrate 2 are exposed and the portion of one of BPR 3 extending beyond the surface of the backside of substrate 2 is encapsulated within the remaining portion of SOG 51.

Figure 8:
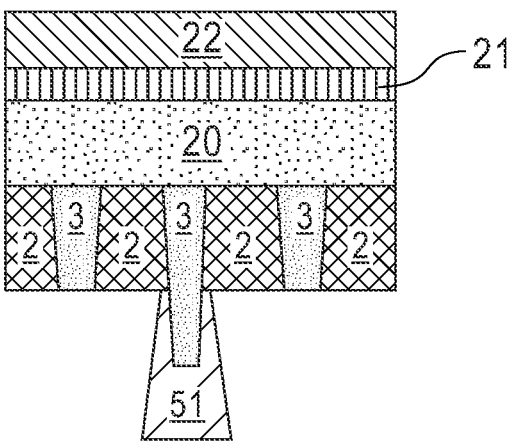
FIG. 8 depicts a cross-sectional view of the semiconductor structure after removing the exposed portions of the BPRs under the semiconductor substrate, in accordance with an embodiment of the present invention.

FIG. 8 depicts a cross-sectional view of semiconductor structure 800 after removing the exposed portions of BPR 3 not encapsulated by SOG 51, in accordance with an embodiment of the present invention. As depicted, FIG. 8 includes the elements of FIG. 7 without the bottom portion of the two of BPR 3 that are not covered by SOG 51. In FIG. 8, using a metal etching process such as a dry etching process (RIE), the exposed bottom portions of the two outside BPR 3 are removed and a middle BPR 3 that is encapsulated inside SOG 51 remains. After the metal etching process, the middle BPR 3 encapsulated in SOG 51 remains and extends below the backside surface of substrate 2. The bottom surface of the two outside BPR 3, which where were not encapsulated by SOG 51, are flush or level with the bottom surface of the backside of substrate 2. As depicted, the surface of the backside of substrate 2 is exposed except for the portion of the surface covered by SOG 51.

FIG. 9 depicts a cross-sectional view of semiconductor structure 900 after removing the remaining portion of SOG 51, in accordance with an embodiment of the present invention. As depicted, FIG. 9 includes carrier wafer 22, interface material 21, interconnect wiring 20, substrate 2 with BPR 3 where one of BPR 3 extends below the backside of substrate 2. The portion of SOG 51 encapsulating one of BPR 3 extending beyond the backside of substrate 2 can be removed using one or more known etching processes such as a dry or wet etching process. After removing SOG 51, the portion of BPR 3 below substrate 2 is exposed. The exposed portion of BPR 3 can have a longer length than the length of conventional BPRs. The width or diameter of BPR 3 extending below substrate 2 can be thin and may have a variable diameter or width of 6-50 microns that may widen to several nm but is not limited to these widths. As previously discussed, the thin portion of BPR 3 extending below the backside of substrate 2 can form a nano through-silicon via that is under the portion of BPR 3 embedded within substrate 2.

FIG. 10 depicts a cross-sectional view of semiconductor structure 1000 after depositing ILD 91 on the backside of substrate 2, in accordance with an embodiment of the present invention. As depicted, FIG. 10 includes the elements of FIG. 10 and ILD 91 over the backside of substrate 2 and BPR 3 extending beyond the surface of the backside of substrate 2. ILD 91 deposited by known deposition processes (e.g., PVD, CVD, etc.) covers the exposed surface of substrate 2 and covers BPR 3. ILD 91 thickness is greater than the length of the exposed portion of BPR 3. In other words, as depicted in FIG. 10, the bottom surface of ILD 91 is below the bottom surface of the middle BPR 3 extending below substrate 2.

FIG. 11 depicts a cross-sectional view of semiconductor structure 1100 after patterning and etching ILD 91 on the backside of substrate 2, in accordance with an embodiment of the present invention. As depicted, FIG. 11 includes the elements of FIG. 10 but with a via hole in the bottom portion of ILD 91. Using known photolithography and etching processes, in various embodiments, the surface of ILD 91 is patterned and a portion of ILD 91 directly over the middle BPR 3 extending beyond the backside of substrate 2 is removed. A portion of ILD 91 remains between the etched hole and the surface of substrate 2. As depicted in FIG. 11, the etched hole exposes the bottom portion of the BPR 3 extending below the backside of substrate 2. The thickness of the remaining portion of ILD 91 under the bottom surface of the etched hole around BPR 3 is sufficient to provide electrical isolation for a metal layer deposited in the etched hole in later process steps. In various embodiments, the etched hole surrounds the bottom portion of at least one BPR 3 extending beyond the surface of the backside of substrate 2. While FIG. 11 depicts one BPR 3 extending below substrate 2, as previously discussed, in other examples, more than one etched via hole may be present when more than one BPR 3 extends beyond the surface of the backside of substrate 2.

FIG. 12 depicts a cross-sectional view of semiconductor structure 1200 after depositing metal 95 on ILD 91 and performing a CMP, in accordance with an embodiment of the present invention. As depicted, FIG. 12 includes ILD 91, metal 95, substrate 2, interconnect wiring 20, interface material 21, carrier wafer 22, and several of BPR 3 where the middle BPR 3 extends beyond the surface of the backside of substrate 2 and the two outside BPR 3 extend to the bottom surface of the backside of substrate 2 (i.e., the bottom surfaces of the two outside BPR 3 are level with the surface of the backside of substrate 2). Metal 95 can be a first metal layer of a backside power delivery network (BSPDN). In some embodiments, metal 95 forms a via with a portion of the bottom surface of metal 95 and the sidewalls of metal 95 surrounded lby ILD 91. Metal 95, as depicted, contacts and surrounds a bottom portion of the middle BPR 3 extending below the bottom surface of substrate 2. Metal 95 does not contact substrate 2 but is isolated from substrate 2 by a portion of ILD 91 under metal 95. In various embodiments, metal 95 and BPR 3 are composed of the same conductive material or metal. In an embodiment, metal 95 and BPR 3 are composed of different metal materials or alloys.

Using one of the known backside interconnect wiring deposition processes (e.g., PVD, CVD, ALD, or plating), a layer of metal 95 is deposited over ILD 91 and around the exposed bottom of the middle BPR 3. For example, metal 95 may be tungsten (W), ruthenium (Ru), cobalt (Co), copper (Cu), or any other metal material or alloy used for interconnect wiring or a BSPDN. In various embodiments, metal 95 is deposited without a liner.

In various embodiments, metal 95 is a first metal layer of a BSPDN. As depicted in FIG. 12, metal 95 is laterally surrounded by ILD 91 and is over a portion of ILD 91. The additional metal layers, dielectric layers, and interconnect wiring of the BSPDN are not depicted in FIG. 12 but can be deposited on ILD 91 and metal 95 in later processing steps. Metal 95 can form a contact or a wire around the bottom portion of BPR 3 extending beyond the backside of substrate 2. As depicted, metal 95 surrounds the bottom portion of the sides of BPR 3 and the bottom surface of BPR 3 to minimize the electrical contact resistance between BPR 3 and metal 95.

In various embodiments, metal 95 is composed of the same material as BPR 3. For example, both metal 95 and BPR 3 are composed of W. In other examples, both metal 95 and BPR 3 can be composed of one of Ru, Co, Cu, or another electrically conductive material. In one example, metal 95 and BPR 3 are composed of different electrically conductive materials or metals. In various embodiments, metal 95 is deposited without a liner material. As previously discussed, in various embodiments, BPR 3 is deposited without a liner (e.g., without a dielectric liner or any other buried power rail liner material). In one example, BPR 3 is deposited in substrate 2 in FIG. 1 with a dielectric liner that is removed from the bottom portion of the BPR 3 extending below the bottom surface of substrate 2 (e.g., in a process step depicted in FIG. 2B or in FIG. 4). In various embodiments, the portion of metal 95 surrounding BPR 3 directly contacts the bottom exposed portion of BPR 3 and exposed sidewalls of the portion of each BPR 3 extending below substrate 2. In some cases, BPR 3 does have an adhesion layer (e.g., TaN, TiN, etc.). After depositing metal 95, a CMP removes excess metal 95 from the surface ILD 91 leaving a portion of metal 95 around the sidewall and the bottom surface of the middle BPR 3, as depicted.

After the CMP, the remaining portion of metal 95 surrounding the bottom portion of the middle BPR 3 can be a portion of a wire, a via, or a contact in the first layer of the BSPDN. In various embodiments, the portion of BPR 3 extending beyond or under the backside of substrate 2 is a nano through-silicon via. In various embodiments, semiconductor structure 1200 provides a continuous conductive material or the same electrically conductive material from a top surface of at least one BPR 3 that extends down through and beyond the bottom surface of the backside surface of substrate 2 and through a portion of ILD 91 to join with metal 95 in the BSPDN. Additionally, semiconductor structure 1200 provides a larger contact area between metal 95 and each of the BPR 3 contacting metal 95 than the contact area of a conventionally formed vias contacting a conventional buried power rail residing in the semiconductor substrate. In various embodiments, metal 95 and BPR 3 do not include a liner (as depicted), or when the liner is removed from the bottom portion of a BPR 3 extending below the backside of substrate 2, semiconductor structure 1200 provides improved electrical performance without an electrical interface or discontinuity due to the interface between the liner in the backside via connecting to a conventional BPR and a metal liner around the first BSPDN metal connecting the via contacting the bottom surface of the conventional BPR.

Additionally, in some cases, BPR 3 can be etched deeper than typical buried power rails (e.g., due to wafer thinning after forming BPR 3). Each of BPR 3 can have a wider diameter at the top surface of substrate 2 that reduces the electrical resistance at the top of BPR 3 compared to conventionally formed BPRs. Each BPR 3 extending beyond the backside surface of substrate 2 are embedded or surrounded on the bottom surface by metal 95 (e.g., a backside via or metal line) and in this way, also semiconductor structure 1200 provides improved electrical performance (e.g., increases the contact area and lowers the contact resistance between metal 95 and BPR 3).

As depicted, semiconductor structure 1200 can provide the same metal or electrically conductive material for BPR 3 and metal 95 to provide a good electrical signal path through substrate 2 to the BSPDN. Additionally, as previously discussed, in various embodiments, no liner has been deposited in either BPR 3 or around metal 95.

Additionally, providing one or more BPR 3 extending beyond the bottom surface of the backside of substrate 2 that directly connects to metal 95 in the BSPDN eases the manufacturing processes and improves yields when compared to conventional methods of connecting a buried power rail to a BSPDN. As previously discussed, forming a conventional via in the BSPDN that connects to a conventional buried power rail embedded in the semiconductor substrate can be challenging. As known to one skilled in the art, etching a via through the BSPDN that narrows as the via extends through BSPDN to contact a bottom surface of a conventional BPR in the semiconductor substrate can be difficult. The bottom surface of the conventional BPR is co-planar or level with the surface of the backside of substrate 2. Etching a narrowing conventional via through the BSPDN to contact a conventional buried power rail is more challenging than forming a trench or a via hole that opens around a BPR 3 that extends into ILD 91 of the BSPDN where ILD 91 is the first layer of interlayer dielectric in the BSPDN (e.g., the via or trench does not need to be etched through the whole BSPDN). In other words, as depicted in FIG. 12, the via hole or trench does not need to extend as far in the BSPDN to contact BPR 3 and for at least this reason, can have a wider diameter. The wider trench or via hole formed in ILD 91 can contact or surround the bottom portion of BPR 3 extending below substrate 2 thereby easing the manufacturing process. Using the methods of forming at least one BPR 3 connecting to metal 95 as a portion of the first metal layer of the BSPDN provides an easier manufacturing process with better yields than conventional methods of connecting a BSPDN to buried power rail residing completely in the semiconductor substrate. In some cases, BPR 3 extending through substrate 2 beyond or below the surface of the backside of substrate 2 may be known as a nanoscale through-silicon-via.

While the invention has been shown and described with reference to certain exemplary embodiments thereof, it will be understood by those skilled in the art that various changes in form and details may be made therein without departing from the spirit and scope of the present invention as defined by the appended claims and their equivalents.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments of the present invention, the practical application or technical improvement over technologies found in the marketplace, or to enable others of ordinary skill in the art to understand the embodiments of the present invention disclosed herein.

What is claimed is:

1. A semiconductor structure comprising:
a via connected to a buried power rail extending below a backside of a semiconductor substrate, wherein the via and the buried power rail are composed of a single metal material,
wherein the via surrounds a bottom portion of the buried power rail extending below the backside of the semiconductor substrate.

2. The semiconductor structure of claim 1, wherein the via is in a first metal layer of a backside power delivery network.

3. The semiconductor structure of claim 1, wherein the via directly contacts the bottom portion of the buried power rail.

4. The semiconductor structure of claim 1, wherein the via is in a layer of interlayer dielectric material, where a portion of the layer of interlayer dielectric material is between the backside of the semiconductor substrate and a bottom surface of the via.

5. The semiconductor structure of claim 4, wherein the via and the buried power rail provide an electrical signal path between the buried power rail and the via in a backside power delivery network using the single metal material.

6. The semiconductor structure of claim 1, wherein the via surrounding the bottom portion of the buried power rail reduces contact resistance between the via and the buried power rail, and wherein the via and the buried power rail do not have a liner.

7. The semiconductor structure of claim 1, wherein a bottom portion of the buried power extending below the backside of the semiconductor substrate is a nanoscale through-silicon via.

8. A semiconductor structure comprising:
a plurality of buried power rails in a semiconductor substrate; wherein a portion of at least one buried power rail is below a backside of the semiconductor substrate;
at least one portion of a first metal layer of a backside power delivery network surrounds the portion of the at least one buried power rail below the semiconductor substrate; and
an interlayer dielectric material isolating the at least one portion of the first metal layer of the backside power delivery network from the backside of the semiconductor substrate.

9. The semiconductor structure of claim 8, wherein the plurality of buried power rails and the at least one portion of the first metal layer of the backside power delivery network are composed of a same conductive material, and wherein the at least one portion of the first metal layer is one of a group of a via, a wire, or a contact in the backside power delivery network.

10. The semiconductor structure of claim 8, wherein the at least one portion of the first metal layer of the backside power delivery network directly contacts a bottom portion of the at least one buried power rail extends below the backside of the semiconductor substrate and a portion of the interlayer dielectric material.

11. The semiconductor structure of claim 10, wherein the at least one buried power rail directly contacts a portion of the semiconductor substrate, a portion of the interlayer dielectric, and the at least one portion of the first metal layer of the backside power delivery network, and wherein the semiconductor substrate is thinned.

12. The semiconductor structure of claim 8, wherein the bottom portion of the at least one buried power rail extends below the backside of the semiconductor substrate is a nanoscale through-silicon via.

13. The semiconductor structure of claim 8, wherein the semiconductor substrate is a thinned semiconductor substrate with one or more front-end of line semiconductor devices.

14. The semiconductor structure of claim 8, wherein the at least one buried power rail extends below the backside of the semiconductor substrate is formed from at least one of the plurality of buried power rails that are etched deeply in an unthinned semiconductor substrate.

15. The semiconductor structure of claim 8, further comprising:

back end of line interconnect wiring on a top surface of the semiconductor substrate;

a layer of interface material on the back end of line interconnect wiring; and a carrier wafer above the layer of interface material.

16. A method of forming a semiconductor structure comprising:

forming a buried power rail from a front side of a semiconductor substrate;

forming interconnect wiring;

bonding a carrier wafer to the front side of the semiconductor substrate;

semiconductor substrate thinning, wherein the buried power rail extends beyond a surface of a backside of the semiconductor substrate;

depositing an optical planarization layer over the backside of the semiconductor substrate;

etching a portion of the optical planarization layer to expose a bottom portion of the buried power rail;

depositing and planarizing a layer of spin-on glass on the optical planarization layer and around the buried power rail;

removing the optical planarization layer;

removing the spin-on glass around the buried power rail;

depositing an interlayer dielectric over the semiconductor substrate and the buried power rail;

etching the interlayer dielectric to expose a bottom portion of the buried power rail extending beyond the backside of the semiconductor substrate; and forming a via around the bottom portion of the buried power rail, wherein the via and the buried power rail are composed of a single metal material, wherein the via surrounds a bottom portion of the buried power rail extending below the backside of the semiconductor substrate.

17. The method of claim 16, wherein the via is in a first metal layer of a backside power delivery network.

18. The method of claim 17, wherein the metal feature and the buried power rail are directly deposited in the interlayer dielectric and the semiconductor substrate, respectively.

* * * * *